United States Patent [19]
Keeth

[11] Patent Number: 5,864,181
[45] Date of Patent: Jan. 26, 1999

[54] BI-LEVEL DIGIT LINE ARCHITECTURE FOR HIGH DENSITY DRAMS

[75] Inventor: Brent Keeth, Boise, Id.

[73] Assignee: Micron Technology, Inc., Boise, Id.

[21] Appl. No.: 950,471

[22] Filed: Oct. 15, 1997

Related U.S. Application Data

[63] Continuation of Ser. No. 442,264, May 15, 1995, abandoned, which is a continuation of Ser. No. 123,027, Sep. 15, 1993, abandoned.

[51] Int. Cl.$^6$ .................................................. H01L 23/48
[52] U.S. Cl. ........................ 257/776; 257/907; 257/908; 365/69; 365/210
[58] Field of Search .................................. 257/304, 907, 257/908, 776, 296; 365/69, 210, 63

[56] References Cited

U.S. PATENT DOCUMENTS

| 4,536,947 | 8/1985 | Bohr et al. | 257/776 |
|---|---|---|---|
| 4,742,018 | 5/1988 | Kimura et al. | 257/776 |
| 4,967,396 | 10/1990 | Kajigaya et al. | 257/911 |
| 4,970,564 | 11/1990 | Kimura et al. | 257/776 |
| 5,014,110 | 5/1991 | Satoh | 257/776 |
| 5,107,459 | 4/1992 | Chu et al. | 365/63 |
| 5,138,412 | 8/1992 | Hieda et al. | 257/401 |
| 5,170,243 | 12/1992 | Dhong et al. | 257/304 |
| 5,206,183 | 4/1993 | Dennison | 257/401 |
| 5,208,180 | 5/1993 | Gonzalez | 257/776 |

FOREIGN PATENT DOCUMENTS

| 60-258795 | 12/1985 | Japan | 257/776 |
|---|---|---|---|
| 600-258795 | 12/1985 | Japan | 257/907 |
| 3-174765 | 7/1991 | Japan | 257/776 |

OTHER PUBLICATIONS

Daisaburo Takashima et al.; "Open/Folded Bit–Line Arrangement for Ultra High–Density DRAMS"; ULSI Research Center, Toshiba Corp.; pp. 89–90.

J.H. Ahn et al.; "Bi–Directional Matched Global Bit Line Scheme for High Density DRAMS"; Research & Development Lab., Goldstar Electronic Company, pp. 91–92.

Michihiro Inoue et al.; "A 16Mb DRAM with an Open Bit–Line Architecture"; IEEE 1988.

Katsutaka Kimura et al.; "A Block–Oriented RAM with Half–Sized DRAM Cell and Quasi–Folded Data–Line Architecture"; IEEE Journal of Solid States Circuits, vol. 26, No. 11; Nov. 1991; pp. 1511–1518.

Hideto Hidaka et al.; "A Divided/Shared Bit–Line Sensing Scheme for ULSI DRAM Cores"; IEEE Journal of Solid–State Circuits, vol. 26, N. 4; Apr. 1991; pp. 473–477.

T. Hamada et al.; "A Split–Level Diagonal Bit–Line (SLDB) Stacked Capacitor Cell for 256MbDRAMS"; 1992 IEEE; pp. 32.1.1–32.1.4.

"A 16Mb DRAM with an Open Bit–Line Architecture." ISSCC 88, Feb. 1988 pp. 246–247.

Hamada et al, IEEE IEDM, Dec. 1992, Tech Digest, pp. 799–801.

*Primary Examiner*—Donald Monin
*Attorney, Agent, or Firm*—Trask, Britt & Rossa

[57] ABSTRACT

There is a bi-level bit line architecture. Specifically, there is a DRAM memory cell and cell array that allows for 6F**2 cell sizes and avoids the signal to noise problems. Uniquely, the digit lines are designed to lie on top of each other like a double decker overpass road. Additionally, this design allows each digit line to be routed on both conductor layers, for equal lengths of the array, to provide balanced impedance. Now noise will appear as a common mode noise on both lines, and not as differential mode noise that would degrade the sensing operation. Furthermore, digit to digit coupling is nearly eliminated because of the twist design.

24 Claims, 7 Drawing Sheets

BI-LEVEL DIGIT LINE ARCHITECTURE FOR HIGH DENSITY DRAMS

This application is a continuation of application Ser. No. 08/442,264 filed May 15, 1995, now abandoned WHICH IS A CON OF Ser. No. 08/123,027, FILED Sep. 15, 1993, abandoned.

FIELD OF THE INVENTION

The present invention relates to integrated circuits (ICs). Particularly, there is a RAM device where digit and digit bar, defined as a pair, are laid out vertically (in the z-axis) to each other, whereas the pairs of digit lines are laid out to be parallel (in the x or y axis) to each other. Additionally, the vertically aligned digit line pairs allow usage of memory cells having a six square feature are ($6F^2$) or less, where F is defined as the minimum realizable photolithographic process dimension feature size.

BACKGROUND OF THE INVENTION

Dynamic random access memory (DRAM) production in the early days resulted in large chips. Manufacturing of these chips, at first, was not concerned with shrinking every part down to its smallest size. At this time the open memory array was the standard design: true digit lines on one side and complement digit (also known as digit bar or digit*) lines on the opposite side, with sense amps in the middle. However, once the DRAMs reached the 256K memory density, shrinking of all features became important.

However, to push to even higher densities, like a one Megabit density, the open architecture proved to be inadequate because of the poorer signal to noise problem. As a result, the folded bit line architecture was developed. Yet, to use this architecture, the original memory cell from the open architecture could not be used. Thus, new cells were designed. There resulted a memory cell with a minimum size of eight square feature area ($8F^2$). The folded architecture eliminated the signal to noise problems. Thus, further shrinkage of the other components on the DRAM resulted in an overall smaller DRAM package.

PROBLEM

For some time now, there have been many ways developed to shrink the die size. However, a new shrinkage barrier has been reached as designs approach densities of 16 and 64 Meg chips. Every aspect of the die now has to be designed with minimal size. Thus, it is now necessary to shrink the previously acceptable eight square feature area ($8F^2$) cells. Cell sizes of six square feature area ($6F^2$) to four square feature area ($4F^2$) are now needed. As a result, customers now need memory cells of six square feature are ($6F^2$) or smaller that will also avoid the previous signal to noise ratio problems.

Note, the above described problem, as well as other problems, is solved through the subject invention and will become more apparent, to one skilled in the art, from the detailed description of the subject invention.

SUMMARY OF THE INVENTION

One skilled in the art will appreciate the advantage of the bi-level bit line architecture. Specifically, there is a DRAM memory cell and cell array that allows for six square feature area ($6F^2$) cell sizes and avoids the signal to noise problems. Uniquely, the digit lines are designed to lay on top of each other like a double decker overpass road. Additionally, this design allows routing of digit lines on both conductor layers, for equal lengths of the array, to provide balanced impedance. Now noise will appear as a common mode noise on both lines, and not as differential mode noise that would degrade the sensing operation. Furthermore, digit to digit coupling is nearly eliminated because of the twist design.

To achieve the digit line switching, several modes of vertical twisting were developed. For a given section of the array, the twists are alternated between adjacent digit line pairs such that the overall twist resembles the traditional folded digit line twist. This twisting of the lines ensures that the signal to noise ratio of the bi-level digit line architecture can be as good as or may be even better than the folded digit line.

Other features and advantages of the present invention may become more clear from the following detailed description of the invention, taken in conjunction with the accompanying drawings and claims, or may be learned by the practice of the invention.

Figure 1:
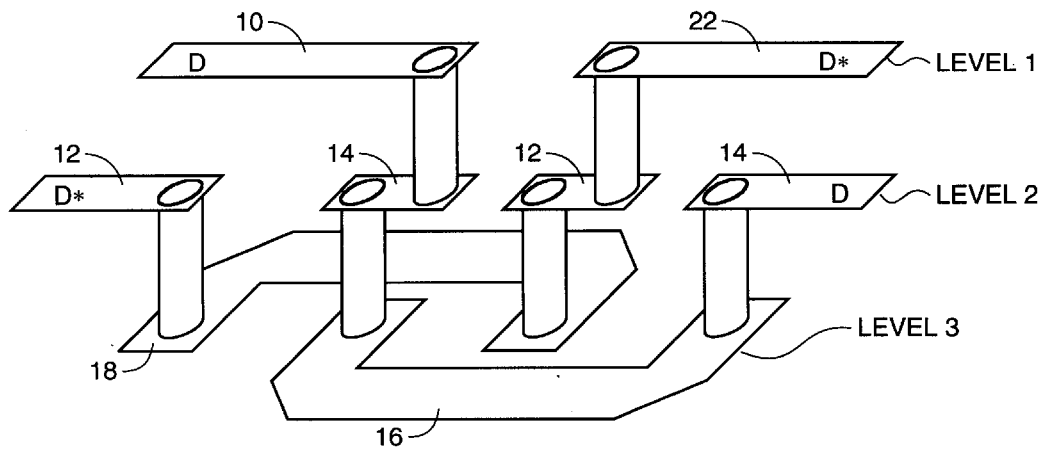
FIG. 1 is an illustration of one embodiment of the invention.

It is noted that the drawings of the invention are not to scale. The drawings are merely schematic representations, and not intended to portray specific parameters of the invention. The drawings are intended to depict only typical embodiments of the invention, and are therefore not to be considered limiting of its scope. The invention will be described with additional specificity and detail through the use of the accompanying drawings, specification, and claims. Additionally, like numbering in the drawings represents like elements within and between drawings.

INCORPORATED MATERIAL

The following U.S. patents are herein incorporated by reference for pertinent and supporting information:

U.S. Pat. No. 5,208,180, is a method of forming a capacitor.

U.S. Pat. No. 5,206,183, is a method of forming a bit line over capacitor array of memory cells.

U.S. Pat. No. 5,138,412, is a dynamic RAM having an improved large capacitance.

U.S. Pat. No. 4,742,018, is a process for producing memory cells having stacked capacitors.

U.S. Pat. No. 4,970,564, is a semiconductor memory device having stacked capacitor cells.

U.S. Pat. No. 4,536,947, is a CMOS process for fabricating integrated circuits, particularly dynamic memory cells with storage capacitors.

General Embodiment

One skilled in the DRAM semiconductor memory cell history and art will easily understand the operation of this Bi-Level Digit line design using an open architecture memory cell of six square feature area ($6F^2$) or smaller feature size and switching of the digit line levels to eliminate the signal to noise ratio problems of the past.

This invention provides a new architecture for a dynamic random access memory (DRAM). The memory is characterized as having a plurality of digit line pairs, with each digit line pair consisting of both a true digit line and a complement digit line. Both digit lines of each digit line pair are electrically insulated from one another by a dielectric layer and vertically aligned along a major portion of their lengths. At one or more positions along their lengths, their positions with respect to one another are reversed. In other words, if the true digit line is initially on top during a first portion of the full length of the pair, the complement digit line is on the bottom and makes contact to a plurality of cells by means of digit line contacts. Using one of the twisting techniques depicted in FIGS. 1 to 4, the complement digit line is brought to the uppermost position while the true digit line is brought to the lowermost position.

Figure 7:
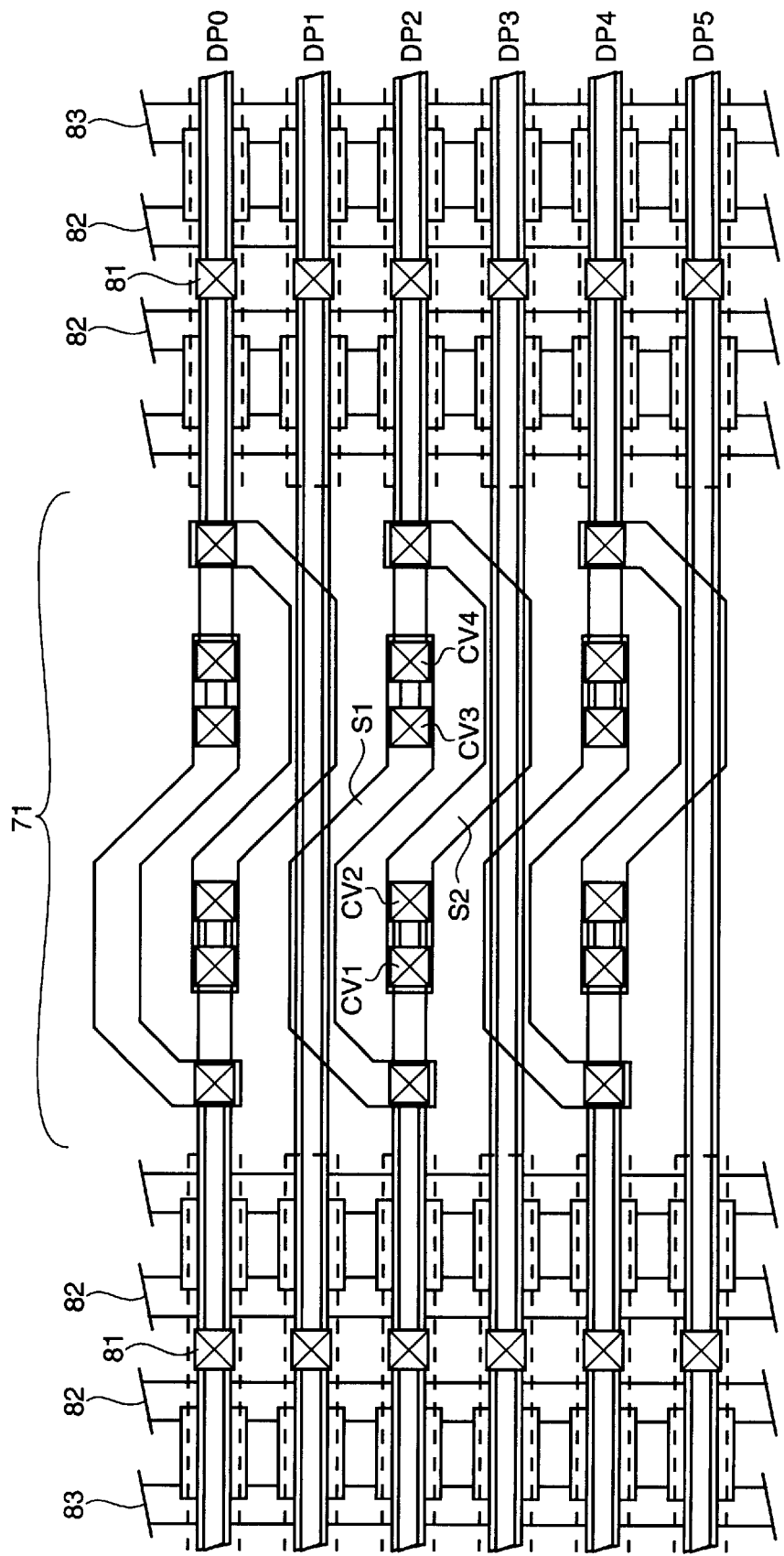
FIG. 7 is a suggested layout for a portion of a DRAM memory array having twisted double-layer digit line pairs.

Further illustrated in FIG. 7, are isolation gates/lines 83 which keep the two adjacent memory cells from biasing each other. Such isolation gates/lines 83 are grounded and are formed of polysilicon and/or other material, such as an insulator material. By having such isolation gates/lines 83 grounded the adjacent memory cells may be more effectively prevented from biasing each other during operation while having higher potentials applied thereto.

Figure 8:
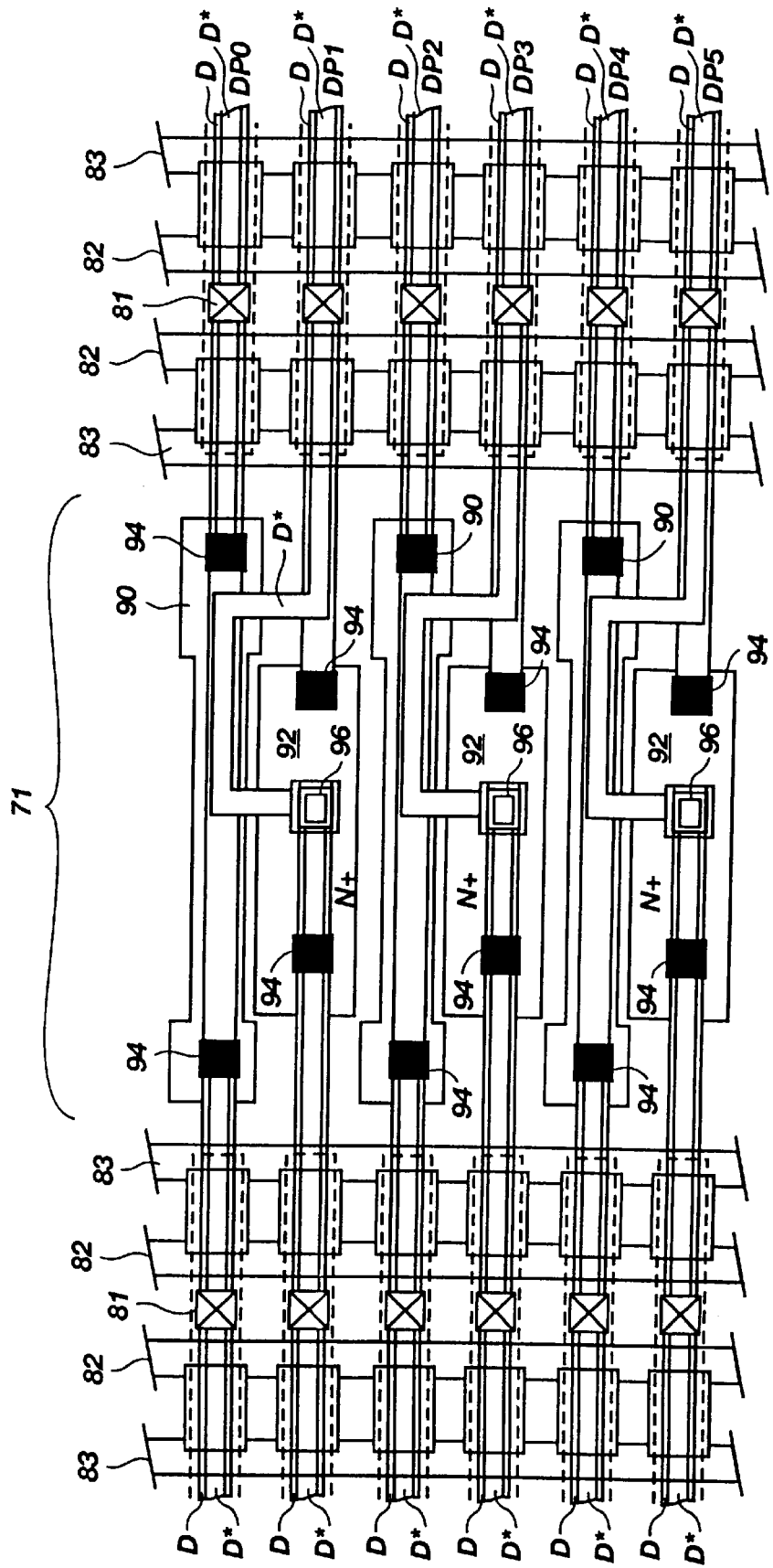
FIG. 8 is an alternative suggested layout for a portion of a DRAM memory array having twisted double-layer digit line pairs.

Referring to drawing FIG. 8, an alternative embodiment of the digit line switching, using vertical twisting, is illustrated. As illustrated, with respect to digit line pair DPO including upper digit line D* and lower digit D, both metal digit lines, the right-hand portion of D* is connected by means of right standard contact 94 to polysilicon area 90 and connected by means of left standard contact 94 from the polysilicon area 90 to the left-hand portion of D* while lower digit line D is insulated from the polysilicon area 90 passing thereabove and thereover. When considering digit line pair DP1, upper digit line D* extends to cross to overlie a portion of digit line D of digit line pair DPO, extends to bit contact 96, and extends over left standard contact 94 being insulated therefrom at the upper level of the digit line pair DP1 of the array while right-hand portion of lower digit line D of the digit line pair DP1 extends to right standard contact 94, in turn, connected to N+ active area 92, in turn, being connected by left standard contact 94 to the left-hand portion of the lower digit line D of the digit line pair DP1. In each instance, when considering the right hand standard contact 94, prior to such contact both digit lines D* and D are located vertically with respect to each other prior thereto in the array and when considering the left standard contact 94, from thereon both digit lines D* and D are located vertically with respect to each of from thereon in the array. Furthermore, the pattern for the arrangement of the digit lines is repeated with respect to digit line pairs DP2, DP3, DP4, and DP5 as described hereinbefore. In this manner the noise is balanced through the use of vertical twists of the digit line pairs and the use of polysilicon areas and active N+ areas of the array. Additionally illustrated and described hereinbefore, are grounded gate isolation areas 83, word lines 82, and bit line contacts 81.

FIG. 1 illustrates one embodiment of the vertical three level downward twist design to achieve equal bit line lengths on the top and bottom of the design. As illustrated, on the left side of the fig., D (digit) line 10 is located directly above D* (D bar) line 12. It is noted that line D 10 drops down to a first plane 14, then to a third plane 16, and is routed around the D* line 12 and then elevated back up the first plane 14. At the second level, D line 10 has achieved a twist in the vertical direction or Z-axis. A similar vertical rotation occurs for D* line 12, except it drops down only one level to plane 18, and proceeds around the third plane 16 location and then elevates to a same second plane 12, and then to plane 22, where it will remain until the next twist is encountered.

It is noted that levels 10 and 22 are on the same plane, as well as planes 12 and 14, and planes 16 and 18, respectively. It also is noted that all of the twisting is relatively in a z direction and that at only two points does the twisting require additional X-Y plane real-estate, that being on level 18 and 16.

Figure 2:
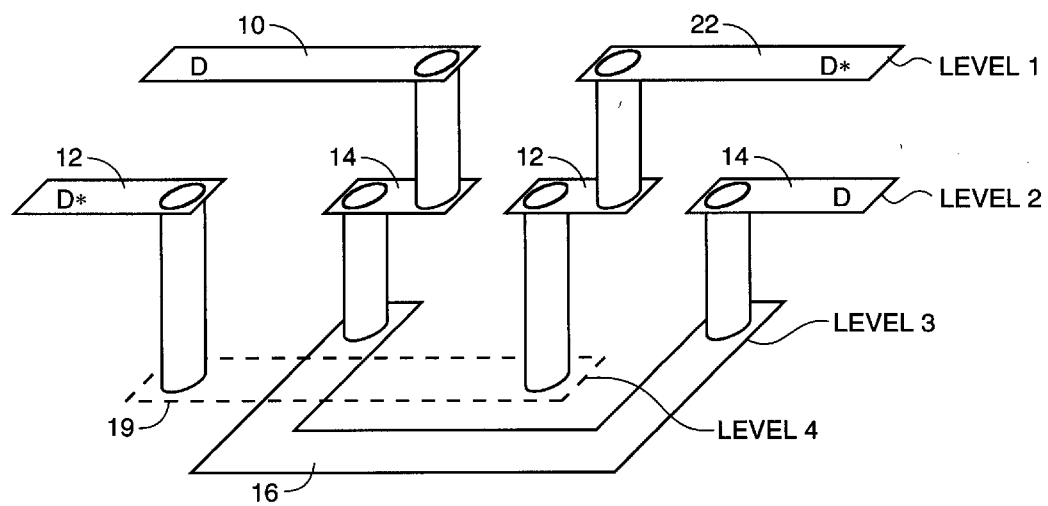
FIG. 2 is an illustration of one embodiment of the invention.

Review of FIG. 2 shows almost an identical twist. However, there are four levels in this twist. Level 4, or plane 19, is located below level 3 and plane 16. Level 4 could be any material, like substrate implant, polysilicon, metal 1, etc., the key factor being that planes 19 and 16 don't create a transistor. A variation of this design is to have plane 19 arranged like plane 18 in FIG. 1 to avoid a transistor if the material would create such.

Figure 3:
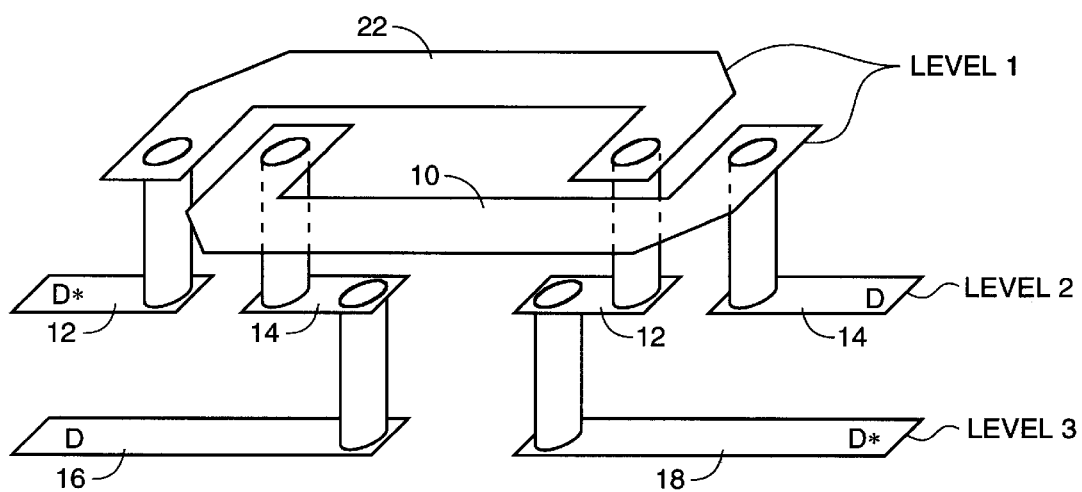
FIG. 3 is an illustration of one embodiment of the invention.

Review of FIG. 3 illustrates a three level twist up architecture. As illustrated, the two digit lines are on the bottom planes, 12, 14, 16 and 18. Whereas the twisting takes place on the upper planes 10 and 22. Again, all the planes are in a vertical orientation to one another. However, planes 10 and 22 do project out into the X-Y planes to accomplish the twist.

Figure 4:
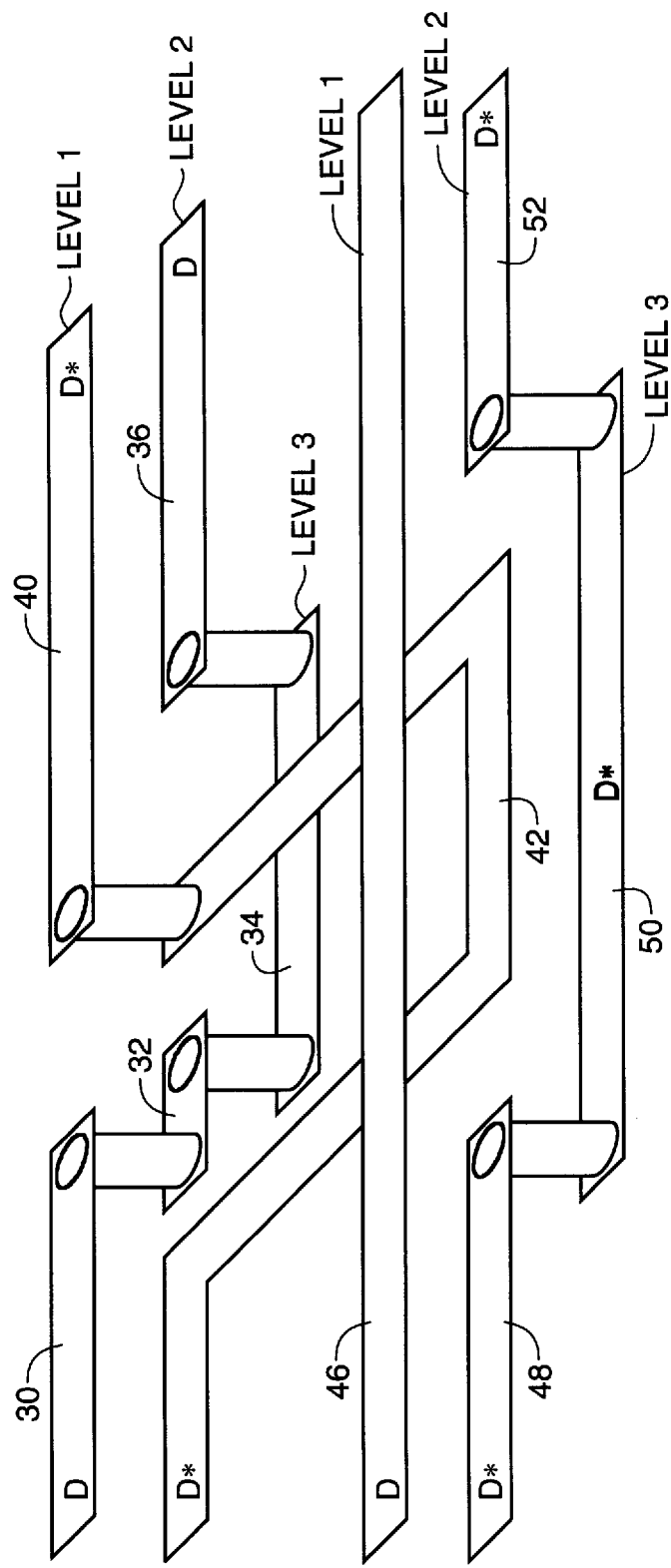
FIG. 4 is an illustration of one embodiment of the invention.

Review of FIG. 4 illustrates a four level downward twist. Digit line (D) 30, is moved down one level via level 32 and 34. While, digit bar (D*) is twisted upward via planes 42 to 40. It is noted that plane or line 42 is the only plane to extend in the X-Y plane, and in fact it extends into the vertical plane of an adjoining pair of digit lines. To accommodate this extension, the bottom line 48 of D* is moved to a fourth lower level 50, and then brought back up to line 52, while digit line 46 has no need to be repositioned since it is elevated above the plane 42.

Figure 5:
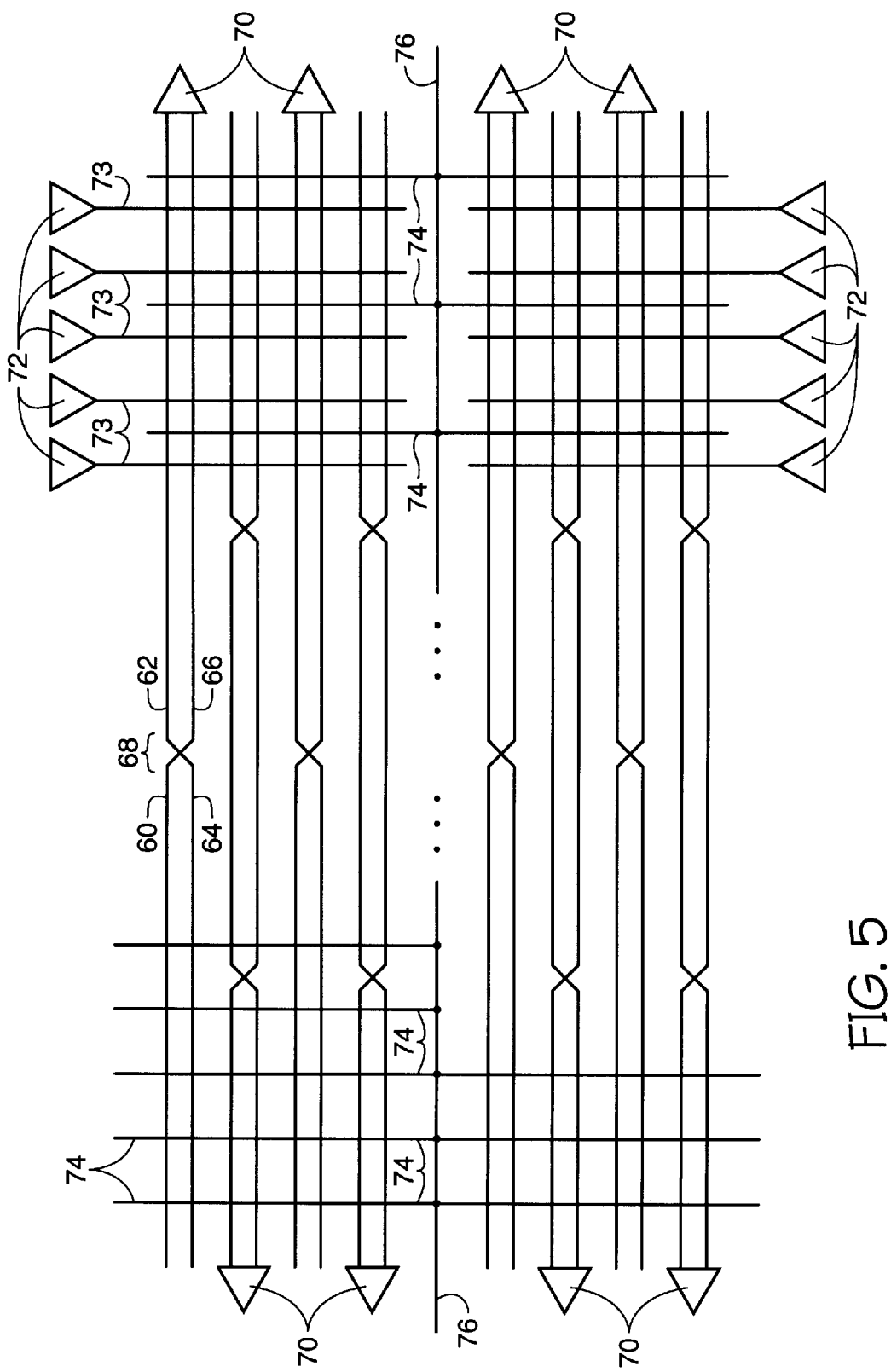
FIG. 5 is an oblique view of a portion of the memory array showing the location of the twists, sense amps, row decodes, and isolation devices.

Review of FIG. 5 illustrates a DRAM and an oblique view of two sections of the array utilizing the bi-level twist architecture. It is noted that, although there are two digit line pairs illustrated, they are in fact vertically oriented, one lying on top of each other. Additionally, the X 68 marks are illustrating where the twisting takes place. It is noted that each line in each pair will spend 50% of the length located on the bottom of the vertical architecture. For example, upper line 60 switches to lower line 66 and lower line 64 moves up to the upper line 62. Of course, the appropriate memory cells will be located near the correct bit line sections to receive the information stored in the cells and feed that into the sense amps 70. An advantage with this architecture is that the row decoders 72, attached to the row lines 73, can be positioned on one side of the array. Additionally, the isolation lines 74 are also symmetrical per array and thus can share a common grounding node 76 located between the two arrays illustrated.

Figure 6:
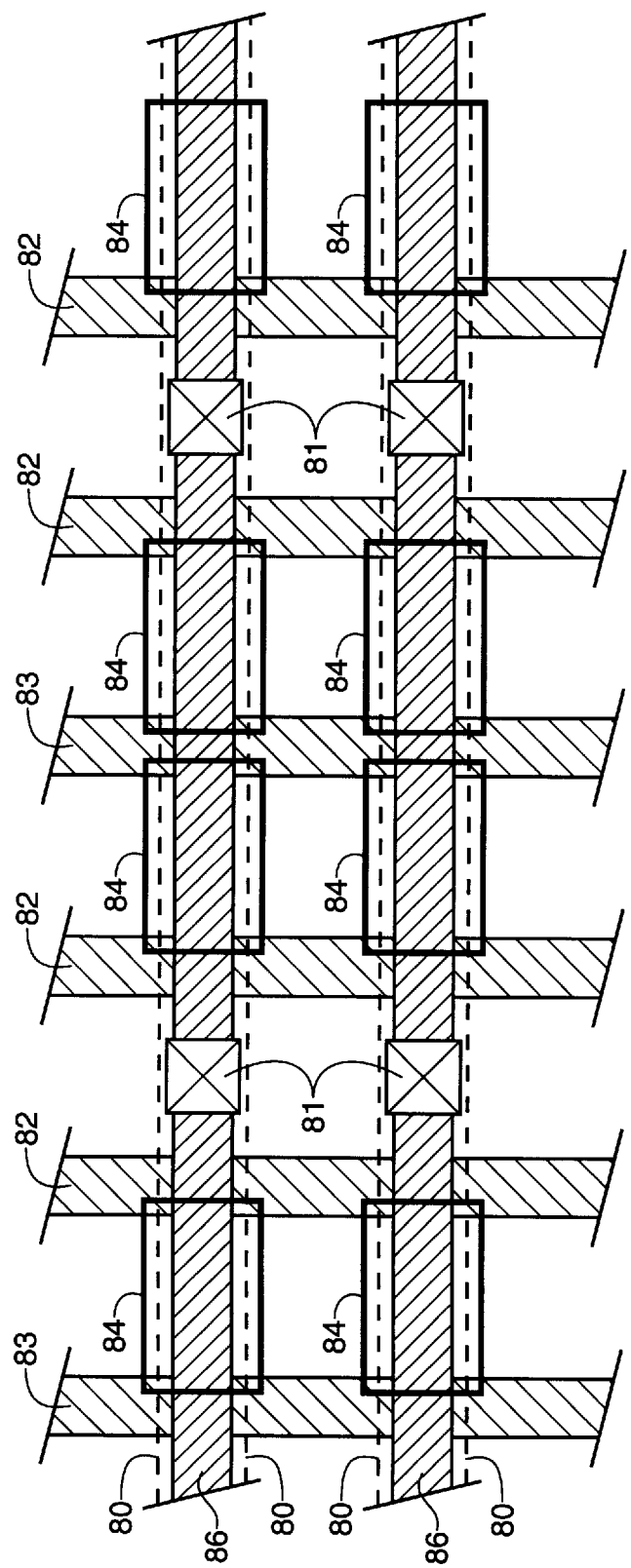
FIG. 6 is a representation of the layout of the present invention.

Attending to FIG. 6, there is an overview of a DRAM exhibiting eight memory cells 84 and the appropriate lines as illustrated. In particular, there is active area 80 running the length of bit lines 86 (though one line is shown, both the D and D* lines are vertically oriented). Word lines 82 will turn on the transistor to access the cells. Bit line contacts 81 will dump the cell charge onto the lower of the digit lines. Isolation gates/lines 83 keep the two adjacent memory cells from biasing each other.

Referring now to FIG. 7 a layout portion of a DRAM array having double-layer twisted digit lines is depicted. Six digit line pairs (DP0, DP1, DP2, DP3, DP4 and DP5) are shown in this abbreviated layout. It will be noted that in the depicted portion of the array, only digit line pairs DP0, DP2 and DP4 undergo a twist. Digit line pairs DP1, DP3 and DP5 are untwisted in this portion of the array. The alternating twist pattern not only provides for efficient reduction of capacitive coupling between adjacent digit line pairs, but it also provides room for the twisting operation. It will be noted that portions of first conductive strip S1 and second conductive strip S2 are vertically aligned with portions of adjacent digit line pairs. This is possible because first and second conductive strips S1 and S2 are not on a level with either of the adjacent double-layer digit lines. The memory cell layout to the right and left of the twist region 71 is similar to that depicted in FIG. 6. Vertical contact vias are represented by the squares marked with an "X". The interconnect pattern is similar to that depicted in FIG. 1. In FIG. 1, Level 2 the digit lines located on plane 12 and 14 would be used to interconnect the corresponding pairs of adjacent contact vias. For example, for digit line pair DP2, the digit line located on plane 14 would interconnect contact vias CV1 and CV2, while the digit line located on plane 12 would interconnect contact via CV3 and CV4.

Remarks about the Invention

It is noted that the signal to noise ratios are kept acceptably low. The vertical arrangement and the crossing digit lines allow for equal top and bottom orientation and access to the appropriate memory cells. Additionally, the adjoining digit pair of lines is also switched appropriately to diminish signal to noise problems.

It is further noted that this array arrangement allows for the smaller cell sizes; for example cells possible from the older open bit line architecture or any new six square feature area ($6F^2$) or smaller cell size, thus allowing smaller arrays using six square feature area ($6F^2$) to four square feature area ($4F^2$) cell sizes.

Still a further advantage is the overall arrangement of the cells, bit lines, word lines, and isolation lines. All devices and lines are laid out to be exactly straight. There is no routing around the cells to open the gates like with the eight square feature area ($8F^2$) designs of the folded array structures.

Additionally, there is one sense amp (S-amp) located on one end of the digit and digit bar lines in an alternating pattern of the S-amp.

It is also noted that the twisting locations in the array are at quarter marks, either the first and third quarter, or at the half way mark in the array. This allows for different digit line pair arrangements to be located next to each other.

Variations in the Invention

There are several obvious variations to the broad invention and thus come within the scope of the present invention. Uniquely, this invention may work with any positioning of the memory cells. Specifically, the cells may be located between, along side, on top, or underneath the bit lines, thus accommodating for trench, stacked, or elevated designs. One skilled in the art would have little trouble using the vertical bi-level bit line arrangement with these other DRAM designs.

Additionally, any layering can be used for the bi-level digit lines. Specifically, the bottom layer could be an implant in the substrate, or poly on top of the substrate, or any of the metals over the poly. It all depends on how high the chip design is stacked and where the memory cells are located.

Similarly, the twisting of the vertical digit lines can be located anywhere in the array, like over $\frac{1}{12}$ of the line. The only requirement is that half of the length of each digit line is located on top and half on the bottom of the vertical arrangement, although it is noted that any increase in the number of twists will increase the size of the array.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Although subheadings in the Detailed Description of the Illustrated Embodiment are used, these are merely provided for assisting the reader; wherein, the writer is free to enter any information under any heading/s.

What is claimed and desired to be secured by United States Patent is:

1. A folded bit line architecture for an integrated dynamic random access memory having at least three vertical levels of circuitry therein comprising:
   a plurality of memory cells;
   a plurality of digit line pairs, each pair having along a portion of the length thereof an uppermost digit line and a lowermost digit line thereby forming a common length, the uppermost digit line and the lowermost digit line thereby having equal lengths, one digit line of each pair functioning as a true digit line while the other digit line of each pair functions as a complement digit line, each digit line of each digit line pair being electrically insulated from one another and vertically aligned along a portion of the common length thereof having a common vertical plane extending vertically through a portion thereof, both digit lines of each digit line pair of said plurality of digit line pairs traversing at least one of said plurality of memory cells along the common length of each digit line pair, each digit line pair undergoing a vertical twist in at least one location along the common length such that the lowermost digit line on one side of the vertical twist becomes the uppermost digit line on the other side of the vertical twist and the uppermost digit line on said one side becomes the lower most digit line on said other side of the vertical twist, with each digit line of a digit line pair making contact to a memory cell of the plurality of memory cells only when the digit line of the digit line pair is the lowermost digit line of a digit line pair, the vertical twist of each digit line pair including one of the uppermost digit line and the lowermost digit line extending from a first level of said at least three levels to another level of said at least three levels and the other of the uppermost digit line and the lowermost digit line extending from the second level of said at least three levels to another level of said at least three levels wherein the uppermost digit line extends from the another level of said at least three levels to the second level of said at least three levels and the lowermost digit line extends from the another level of said at least three levels to the first level of said at least three levels of said integrated dynamic random access memory, the uppermost digit line located vertically above the lowermost digit line on one side of the vertical twist of the digit lines of the digit line pair and the uppermost digit line located vertically below the lowermost digit line on the other side of the vertical twist, the common vertical plane extending through a portion of the uppermost digit line and the lowermost digit line on each side of the vertical twist; and a sense amplifier coupled to each digit line pair of said plurality of digit line pairs.

2. The dynamic random access memory of claim 1, wherein each vertical twist of the digit line pair is accomplished in an area of said plurality of memory cells of said dynamic random access memory by coupling the uppermost digit line on one side of the memory cell and the lowermost digit line on the other side of the memory cell with a first conductive member, and by coupling the lowermost digit line on said one side of the memory cell and the uppermost digit line on said other side of the area of said plurality of said memory cells with a second conductive member.

3. The dynamic random access memory of claim 2, wherein said first conductive member and second conductive member are each located at a level other than that which either the uppermost digit line occupies or the level which the lowermost digit line occupies.

4. The dynamic random access memory of claim 3, wherein said first conductive member and second conductive member are each located at a common level.

5. The dynamic random access memory of claim 2, wherein said first conductive member and second conductive member are located at different levels.

6. A folded bit line architecture for an integrated dynamic random access memory having a plurality of memory cells and at least three vertical levels of circuitry therein comprising:

a plurality of digit line pairs, one digit line of each pair functioning as a true digit line while the other digit line functions as a complement digit line, both digit lines of each digit line pair being electrically insulated from one another and vertically aligned along a portion of their common length having a common vertical plane extending vertically through a portion thereof, the uppermost digit line and the lowermost digit line thereby having equal lengths, each digit line pair undergoing a vertical twist in at least one location along said common length such that the lowermost digit line on one side of the vertical twist becomes the uppermost digit line on the other side of the vertical twist, and the uppermost digit line on said one side of the vertical twist becomes the lowermost digit line on said other side of the vertical twist, the vertical twist of each digit line pair including one of the uppermost digit line and the lowermost digit line extending from a first level of said at least three levels to another level of said at least three levels to the second level of said at least three levels and the other of the upper most digit line and the lowermost digit line extending from the second level of said at least three levels to another level of said at least three levels to the first level of said at least three levels of said integrated dynamic random access memory, the uppermost digit line located vertically above the lowermost digit line on one side of the vertical twist of the digit lines of the digit line pair and the uppermost digit line located vertically below the lowermost digit line on the other side of the vertical twist, the common vertical plane extending through a portion of the uppermost digit line and the lowermost digit line on each side of the vertical twist; and a sense amplifier coupled to each digit line pair of said plurality of digit line pairs.

7. The dynamic random access memory of claim 6, wherein each vertical twist of each digit line pair is accomplished in a portion of the dynamic random access memory where no memory cells are located by coupling the uppermost digit line on one side of said portion and the lowermost digit line on the other side of said portion with a first conductive member, and by coupling the lowermost digit line on said one side of said portion and the uppermost digit line on said other side of said portion with a second conductive member, said first conductive member and second conductive member not being located at either a level which the uppermost digit line is located or a level which the lowermost digit line is located.

8. The folded bit line architecture of claim 7, wherein said first conductive member and second conductive member are located at a common level.

9. The folded bit line architecture of claim 7, wherein said first conductive member and second conductive member are located at different levels.

10. An integrated circuit memory device having a folded bit line architecture, having a plurality of memory cells, and having at least three levels of circuitry therein, said device comprising:

a plurality of digit line pairs, one digit line of each pair functioning as a true digit line while the other digit line functions as a complement digit line, both digit lines of each digit line pair being electrically insulated from one another and vertically aligned along a portion of their common length having a common vertical plane extending vertically through a portion thereof, an uppermost digit line and a lowermost digit line thereby having equal lengths, each digit line pair undergoing a vertical twist in at least one location along said common length such that the lowermost digit line on one side of the vertical twist becomes the uppermost digit line on the other side of the vertical twist, and the uppermost digit line on said one side of the vertical twist becomes the lowermost digit line on said other side of the vertical twist, the vertical twist of each digit line pair including one of the uppermost digit line and the lowermost digit line extending from a first level of said at least three levels to another level of said at least three levels to the second level of said at least three levels and the other of the uppermost digit line and the lowermost digit line extending from the second level of said at least three levels to another level of said at least three levels to the first level of said at least three levels of said integrated circuit memory device, the uppermost digit line located vertically above the lowermost digit line on one side of the vertical twist of the digit lines of the digit line pair and the uppermost digit line located vertically below the lowermost digit line on the other side of the vertical twist, the common vertical plane extending through a portion of the uppermost digit line and the lowermost digit line on each side of the vertical twist; and an amplifier coupled to each digit line pair of said plurality of digit line pairs.

11. The integrated circuit memory device of claim 10, wherein each vertical twist of each digit line pair is accomplished in a portion of the integrated circuit memory device where no memory cells are located by coupling the uppermost digit line on one side of said portion and the lowermost digit line on the other side of said portion with a first conductive member, and by coupling the lowermost digit line on said one side of said portion and the uppermost digit line on said other side of said portion with a second conductive member, said first conductive member and second conductive member not being located at either a level which the uppermost digit line is located or a level which the lowermost digit line is located.

12. The integrated circuit memory device of claim 11, wherein said first conductive member and second conductive member are located at a common level.

13. The integrated circuit memory device of claim 11, wherein said first conductive member and second conductive member are located at different levels.

14. The folded bit line architecture of claim 11, wherein said first conductive member and said second conductive member are located at levels other than that of either the uppermost digit line or the lowermost digit line.

15. The folded bit line architecture of claim 14, wherein said first and second conductive members are located on a portion of a common plane in said dynamic random access memory.

16. The folded bit line architecture of claim 11, wherein said first conductive member and said second conductive member are located on portions of a common plane in said dynamic random access memory.

17. A folded bit line architecture for an integrated dynamic random access memory, having a plurality of memory cells, and having at least three levels of circuitry therein, said memory comprising:

a plurality of double-layer digit line pairs, each pair having along a portion of its length an uppermost digit line and a lowermost digit line, both digit lines of each digit line pair being electrically insulated from one another and vertically aligned along a portion of their common length having a common vertical plane extending vertically through a portion thereof, the uppermost digit line and the lowermost digit line thereby having equal lengths, each digit line pair undergoing a vertical twist in at least one location along said common length such that the lowermost digit line on one side of the vertical twist becomes the uppermost digit line on the other side of the vertical twist, and the uppermost digit line on said one side of the vertical twist becomes the lowermost digit line on said other side of the vertical twist, the vertical twist of each digit line pair including one of the uppermost digit line and the lowermost digit line extending from a first level of said at least three levels to another level of said at least three levels to the second level of said at least three levels and the other of the uppermost digit line and the lowermost digit line extending from the second level of said at least three levels to another level of said at least three levels to the first level of said at least three levels of said integrated dynamic random access memory, the uppermost digit line located vertically above the lowermost digit line on one side of the vertical twist of the digit lines of each digit line pair and the uppermost digit line located vertically below the lowermost digit line on the other side of the vertical twist, the common vertical plane extending through a portion of the uppermost digit line and the lowermost digit line on each side of the vertical twist; and a sense amplifier coupled to each digit line pair of said plurality of digit line pairs.

18. A folded bit line architecture for an integrated dynamic random access memory having at least three vertical levels of circuitry therein comprising:

a plurality of memory cells;

a plurality of digit line pairs, each pair having along a portion of a length thereof an uppermost digit line and a lowermost digit line thereby forming a common length, one digit line of each pair functioning as a true digit line while the other digit line of each pair functions as a complement digit line, each digit line of each digit line pair being electrically insulated from one another and vertically aligned along a portion of the common length thereof having a common vertical plane extending vertically through a portion thereof, the uppermost digit line and the lowermost digit line thereby having equal lengths, both digit lines of each digit line pair of said plurality of digit line pairs traversing at least one of said plurality of memory cells along the common length of each digit line pair, each digit line pair undergoing a vertical twist in at least one location along the common length such that the lowermost digit line on one side of the vertical twist becomes the uppermost digit line on the other side of the vertical twist and the uppermost digit line on said one side of the vertical twist becomes the lowermost digit line on said other side of the vertical twist, with each digit line of a digit line pair making contact to a memory cell of the plurality of memory cells only when the digit line of the digit line pair is the lowermost digit line, the vertical twist of each digit line pair including one of the uppermost digit line and the lowermost digit line extending from a first level of said at least three levels to another level of said at least three levels and the other of the uppermost digit line and the lowermost digit line extending from the second level of said at least three levels to another level of said at least three levels wherein the uppermost digit line extends from the another level of said at least three levels to the second level of said at least three levels and the lowermost digit line extends from the another level of said at least three levels to the first level of said at least three levels of said integrated dynamic random access memory, the uppermost digit line located vertically above the lowermost digit line on one side of the vertical twist of the digit lines of each digit line pair and the uppermost digit line located vertically below the lowermost digit line on the other side of the vertical twist, the common vertical plane extending through a portion of the uppermost digit line and the lowermost digit line on each side of the vertical twist;

a sense amplifier coupled to each digit line pair; and an isolation gate line connected to adjacent memory cells of said plurality of memory cells.

19. The folded bit line architecture of claim 18, wherein said isolation gate line includes an isolation gate line wherein said isolation gate line is suitable for grounding thereof using a common ground node.

20. The folded bit line architecture of claim 18, wherein said isolation gate line includes an isolation gate line of polysilicon.

21. The folded bit line architecture of claim 18, wherein said isolation gate line includes an isolation gate line of polysilicon material wherein said isolation gate line is suitable for grounding thereof.

22. The folded bit line architecture of claim 18, wherein said isolation gate line includes an insulator isolation gate line wherein said isolation gate line is suitable for grounding thereof.

23. The folded bit line architecture of claim 18, wherein said isolation gate line includes an insulator isolation gate line of polysilicon material wherein said isolation gate line is suitable for grounding thereof.

24. The folded bit line architecture of claim 18, wherein each vertical twist of each digit line pair is accomplished in a memory cell region of said dynamic random access memory by coupling the uppermost digit line on one side of a memory cell of said plurality of memory cells and the lowermost digit line on the other side of the memory cell with a first conductive member, and by coupling the lowermost digit line on said one side of said memory cell of said plurality of memory cells with a second conductive member.

* * * * *

UNITED STATES PATENT AND TRADEMARK OFFICE
CERTIFICATE OF CORRECTION

PATENT NO. : 5,864,181
DATED : January 26, 1999
INVENTOR(S) : Keeth

It is certified that error appears in the above-identified patent and that said Letters Patent is hereby corrected as shown below:

Title page,
Item [21], "Appl. No." change "950,471" to -- 08/950,471 --.
Item [56] "References Cited" in "Foreign Patent Documents: delete second entry "600-258795 . . ."; and "References Cited" in "Other Publications", second column, last two entries were not cited; and
"Abstract," Item [57], line 2, delete "6F**2" and insert therefor -- six square feature area ($6F^2$) --.

Column 1,
Lines 5-6, delete "WHICH IS A CON OF" and insert therefor -- which is a continuation of --; and also delete "FILED" and insert -- filed -- therefor;
Line 17, change "are" to -- area --;
Line 54, change "are" to -- area --;

Column 2,
Line 59, after "over" insert -- a --;

Column 3,
Line 38, after "lower digit" insert -- line --;
Line 39, after "of" insert -- upper digit line --;
Line 42, after "of" insert -- upper digit line --;
Line 45, change "to" to -- or --;
Line 46, after "portion of" insert -- lower --;
Line 54, change "right-hand" to -- right --;
Line 59, change "of" to -- other --; and delete "from thereon";
Line 66, change "hereinbefore" to -- herein --;

Column 4,
Line 4, after "10" insert -- (also referred to as plane 10) --;
Line 5, after "12" and before "." insert -- (also referred to as plane 12) --; and change "line D 10" to -- D line 10 --;
Line 14, change "levels" to -- planes --; and change "plane" to -- level --;

UNITED STATES PATENT AND TRADEMARK OFFICE
CERTIFICATE OF CORRECTION

PATENT NO. : 5,864,181
DATED : January 26, 1999
INVENTOR(S) : Keeth

It is certified that error appears in the above-identified patent and that said Letters Patent is hereby corrected as shown below:

Line 18, change "level" to -- levels --;
Line 30, after "planes" delete ","; after "18" change "." to -- , --; and change "Whereas" to -- whereas --;
Line 36, after "30" delete "," and change "level" to -- planes --;
Line 37, change "34. While," to -- 34, while --;
Line 42, after "level" insert -- or plane --;
Line 49, change "each" to -- the -- and delete "are";
Line 50, change "illustrating" to illustrate --;

Column 5,
Line 24, change "plane" to -- planes --;
Line 29, change "via" to -- vias --; and
Line 38, after "sizes" change ";" to -- , -- and after "example" insert -- , --.

Claims,
Column 6,
Line 27, change "the" to -- a --;
Line 46, change "lower most" to -- lowermost --;

Column 7,
Line 6, delete "dynamic random access memory: and insert -- folded bit line architecture -- therefor;
Line 16, delete "dynamic random access memory" and insert -- folded bit line architecture -- therefor;
Line 17, after "and" insert -- said --;
Line 21, delete "dynamic random access memory" and insert -- folded bit line architecture -- therefor;
Line 22, after "and " insert -- said --;
Line 24, delete "dynamic random access memory" and insert -- folded bit line architecture -- therefor;
Line 25, after "and" insert -- said --;
Line 37, delete "the " and insert -- an -- therefor;

UNITED STATES PATENT AND TRADEMARK OFFICE
CERTIFICATE OF CORRECTION

PATENT NO. : 5,864,181
DATED : January 26, 1999
INVENTOR(S) : Keeth

It is certified that error appears in the above-identified patent and that said Letters Patent is hereby corrected as shown below:

Line 38, delete "the" and insert -- a -- therefor;
Line 51, change "upper most" to -- uppermost --;
Line 66, delete "dynamic random access memory" and insert -- folded bit line architecture -- therefor;

Column 8,
Line 7, after "and" insert -- said --;
Line 12, after "and" insert -- said --;
Line 15, after "and" insert -- said --;
Line 65, after "and" insert -- said --;
Line 70, after "and" insert -- said --;

Column 9,
Line 2, after "and" insert -- said --;
Line 4, delete "folded bit line architecture" and insert -- integrated circuit memory device -- therefor;
Line 8, delete "folded bit line architecture" and insert -- integrated circuit memory device -- therefor;
Line 10, change "said" to -- a --;
Line 12, delete "forlded bit line architecture" and insert -- integrated circuit memory device -- therefor; and
Line 14, change "said" to -- a --.

Signed and Sealed this

Twenty-seventh Day of November, 2001

*Attest:*

*Attesting Officer*

NICHOLAS P. GODICI
*Acting Director of the United States Patent and Trademark Office*